United States Patent [19]
Kosonocky

[11] 3,986,198
[45] Oct. 12, 1976

[54] INTRODUCING SIGNAL AT LOW NOISE LEVEL TO CHARGE-COUPLED CIRCUIT

[75] Inventor: Walter Frank Kosonocky, Skillman, N.J.

[73] Assignee: RCA Corporation, New York, N.Y.

[22] Filed: Apr. 7, 1975

[21] Appl. No.: 565,563

Related U.S. Application Data

[63] Continuation of Ser. No. 369,580, June 13, 1973, abandoned.

[52] U.S. Cl. .............................. 357/24; 307/221 C
[51] Int. Cl.² ......................................... H01L 29/78
[58] Field of Search .................... 357/24; 307/221 C

[56] References Cited
UNITED STATES PATENTS

| | | | |
|---|---|---|---|
| 3,789,267 | 1/1974 | Krambeck et al. | 357/24 |
| 3,881,117 | 4/1975 | Tompsett | 357/24 |

OTHER PUBLICATIONS

W. Engeler et al., "A Memory System Based on Surface-Charge Transport," IEEE J. OFS-S, CKTS, vol. 5C-6 No. 5, Oct. 1971, pp. 306-313.
W. Kosonocky et al., "Charge-Coupled Digital Circuits," IEEE J. OFS-S, CKTS, vol. SC-6 No. 5, Oct, 1971, pp. 314-322.
R. Krambeck et al., "A Doped Surface Two-Phase CCD," Bell System Tech. J., vol. 51, No. 8, Oct. 1972, pp. 1849-1866.

*Primary Examiner*—Michael J. Lynch
*Assistant Examiner*—Joseph E. Clawson, Jr.
*Attorney, Agent, or Firm*—H. Christoffersen; Samuel Cohen

[57] ABSTRACT

The first potential well of a charge-coupled device (CCD) register is initially filled from a source diffusion and then the effective depth of this well is reduced and the excess charge removed. The depth reduction and charge removal may be concurrently accomplished by changing the relative potential between the source diffusion and the electrode or electrodes producing the first potential well in a sense to cause this diffusion to operate as a drain for the excess charge. The charge remaining in the first potential well is relatively noise free, that is, it is at a predictable and reproducible level.

9 Claims, 10 Drawing Figures

INTRODUCING SIGNAL AT LOW NOISE LEVEL TO CHARGE-COUPLED CIRCUIT

STATEMENT

The invention described herein was made in the course of or under a contract or a subcontract thereunder with the Department of the Navy.

This is a continuation of application Ser. No. 369,580 filed June 13, 1973 now abandoned.

The input circuit to a known charge-coupled register is illustrated in FIG. 1. Details of this circuit and a number of other input circuits may be found in copending application Ser. No. 106,381 for "Charge Coupled Circuits" filed Jan. 14, 1971 by the present inventor and assigned to the same assignee as the present application.

In the operation of a circuit such as shown in FIG. 1, the source diffusion S is slightly reverse biased and operates as a source of minority carriers (holes in the case of the N type silicon substrate illustrated). The charge may be introduced to the surface of the substrate beneath the gate electrode $G_2$ by applying a negative pulse produced by source 10 to the first gate electrode $G_1$. This pulse causes a conduction channel to extend from the source diffusion S to the region beneath the electrode $G_2$. If this electrode is placed at a suitable negative potential, the minority charge carriers travel from the source diffusion to the potential well present under gate $G_2$. These charges subsequently may be shifted along the register by the three phase voltages applied to the electrodes. The transfer process is discussed in detail in the copending application.

It has been found during the several years that charge-coupled circuits have been known, that the amount of charge signals introduced into the first potential well is not accurately predictable, even though the various voltages employed are accurately controlled and the duration of the negative pulse produced by source 10 is accurately controlled. Such random variations in the amount of charge introduced into the first potential well is defined here as noise due to electrically introduced input signal.

Other sources of noise in charge-coupled devices are the noise due to optically introduced signal, noise associated with the thermally generated background charge, and transfer noise due to incomplete transfer of charge and charge trapping by the fast surface states. These are discussed in J. E. Carnes and W. F. Kosonocky, "Noise Sources in Charge-Coupled Devices," RCA Review Vol. 33, p. 327, June 1972. The present application deals with none of these but rather only with the method and apparatus for the selective noise-free electrical introduction of charge into the input circuit of a charge-coupled device cicuit.

The circuit of FIG. 1 may be operated in a number of different ways. In one, the negative pulse produced at 10, which may be thought as the input signal $V_{in}$, is of relatively low amplitude. This creates a relatively high impedance conduction channel and in this condition, the source diffusion S operates as a constant current source. (It simulates a source of high internal impedance). When operating in this way, the charge carriers flowing through the conduction channel during the time the input signal is relatively negative are emitted from the source in random fashion and introduce what is known as "shot noise". What this means, in a somewhat qualitative way, is that even though gate electrode $G_1$ may be kept on for a very accurately measured time interval and may be maintained at a very well defined potential, there is an uncertainty as to the precise number of charge carriers which will pass through the conduction channel formed beneath the gate electrode $G_1$ and will accumulate in the first potential well (the potential well beneath electrode $G_2$).

In an effort to overcome the problem above, the amplitude of the input signal $V_{in}$ may be increased to make the conduction channel impedance very low thus filling the potential well to the level of the source potential. A theory which has been developed indicates that this does indeed eliminate shot noise. Notwithstanding such elimination of shot noise, it is still found that the charge accumulated in the first potential well is not accurately predictable. The reason, it is thought, is that when the gate electrode $G_1$ is turned off, that is when the input signal $V_{in}$ goes from its relatively negative to its relatively positive value, the relatively large number of carriers present in the conduction channel produced by gate $G_1$ must flow somewhere. It is thought that some of these carriers, rather than returning to the source electrode S, instead return to the first potential well (the well beneath electrode $G_2$). The number of such charge carriers which end up in the first potential well is not accurately predictable and this uncertainty in the level to which the first potential well is filled can be considered to be noise, which for purposes of this discussion will be termed "partition noise".

In the second method discussed above there is also a second source of noise. This noise is known as capacitive noise and is proportional to the square root of capacitance associated with the first potential well (this is discussed in the RCA Review article above).

In a number of embodiments of the invention described in the copending application above, the source electrode is pulsed. However, the noise problems remain the same. The operation is such that even when the source is pulsed, it is always attempted to fill the first potential well to some predetermined level proportioned to the magnitude and duration of the voltage employed for pulsing. In all of these embodiments, the source electrode is either operated as a constant current source with the accompanying shot noise or with low conduction channel impedance which results in the introduction of partition noise when the conduction channel collapses.

In the various embodiments of the present invention, the first potential well of a charge-coupled circuit is initially filled to at least a given depth, then the depth of the well is effectively lowered to a value defined by the difference between two surface potentials, to remove a portion of the charge formerly present in the well. As will be pointed out in more detail below, establishing a charge signal in this way is relatively noise free in the sense that the charge remaining in the first potential well is accurately predictable and reproducible.

The invention is illustrated in the drawing of which:

Figure 1:
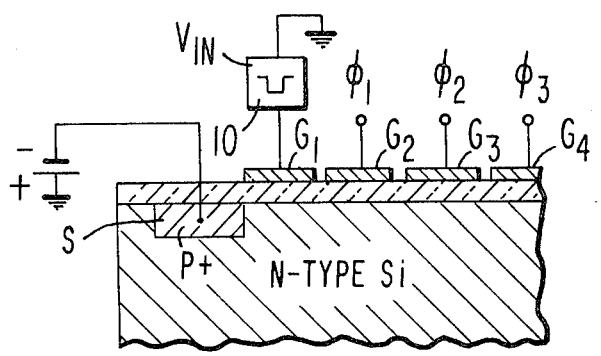
FIG. 1 is a section through the input circuit of a prior art charge-coupled register.
Figure 2:
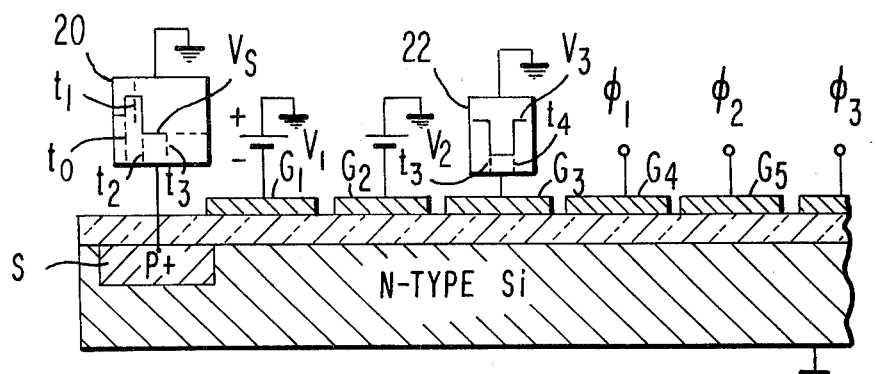
FIG. 2 is a section through a charge-coupled register operated in accordance with one form of the present invention.

The structure of the circuit of FIG. 2 is very similar to that of FIG. 1. However, the source S, rather than being operated at a fixed potential, is driven by a voltage $V_S$ produced by source 20. The gate electrode $G_1$ is operated at a fixed potential $V_1$. The gate electrode $G_2$ is also operated at a fixed potential $V_2$, where $V_2$ is more negative than $V_1$. The gate electrode $G_3$ is connected to a voltage source 22 which applies a negative pulse $V_3$ to this electrode.

Figure 3:
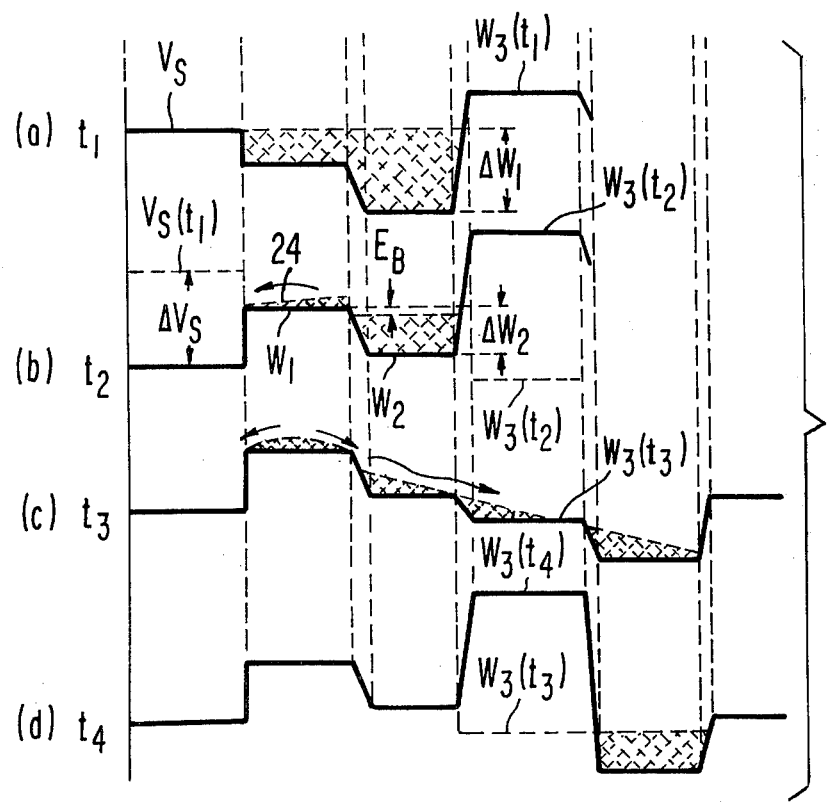
FIG. 3 is a drawing of surface potentials present at the semiconductor substrate of the device of FIG. 2 during various time intervals.

The operation of the circuit may be understood by referring to FIG. 3. The surface potential profiles shown represent the surface potentials existing at the source S and the various gates, the potential lines being aligned with the structures which produce these surface potentials.

At time $t_1$ (surface potential profile a of FIG. 3), the source diffusion S is at a relatively positive value such that it operates as a source of minority carriers (holes). Actually this relatively positive value may be several volts negative so that the PN junction formed by the source electrode may be slightly reverse biased. The gate electrode $G_1$ is sufficiently negative that a conduction channel is present beneath this gate electrode. The gate electrode $G_2$ is at a potential sufficiently negative that a potential well forms beneath this gate electrode. With these potentials, the charge carriers flow through the conduction channel and fill the first potential well to the level indicated. The depth of this first potential well can be considered as the surface potential difference $\Delta W_1$ between the source potential $V_S$ and the initial surface potential beneath electrode $G_2$. The charge carriers cannot flow to the portion of the substrate surface beneath electrode $G_4$, as the third gate electrode $G_3$ is at a relatively positive potential. This causes a potential barrier to exist between the potential well beneath electrode $G_2$ and the potential well beneath electrode $G_4$.

At time $t_2$, the source potential $V_S$ goes to a relatively negative value sufficiently so that the source S acts as a drain for charge carriers. Charge carriers now flow from the first potential well and through the conduction channel beneath electrode $G_1$ to the diffusion S. The effect of changing the potential of the diffusion S is to reduce the effective depth of the first potential well from $\Delta W_1$ to $\Delta W_2$.

In the introductory portion of this application, the noise problem is discussed. During the transfer of charge from the source diffusion to the first potential well (the well beneath gate $G_2$) this same kind of noise is present here. This means that the charge signal initially present (time $t_1$) may be noisy, that is, its amplitude is not accurately predictable. However, this is of no importance in the present system because this charge signal is not the one of interest and will not be the charge signal which is propagated down the register.

At time $t_2$, when the effective depth of the first potential well is reduced, the charge now in excess in the first well flows through the conduction channel beneath $G_1$ back to the source S. If the potentials $V_1$ and $V_2$ are accurately maintained at a given level during this reverse flow of charge, the charge signal remaining in the first potential well will be relatively noise free. Although the reverse charge flow may be noisy, the surface charge beneath $G_2$ is relaxing from a relatively high, somewhat uncertain value, to a lower value accurately defined by the difference between two surface potentials $W_1$ and $W_2$. This reverse charge flow, however, does not stop abruptly but rather continues due to thermal emission of charge from the first potential well, until a sufficiently large barrier forms between the surface potential beneath the electrode $G_1$ and the quasi-Fermi level at the first potential well.

Because of the above thermal emission the present process is not absolutely noise free and there is some thermal noise present. This noise occurs because some (a relatively small number) of the charge carriers stored in the first potential well are sufficiently energetic to climb over the potential barrier $W_1$ (see FIG. 3b) and escape from the potential well. These energetic carriers are illustrated schematically at 24 and they result in a degree of uncertainty in the extent to which the first potential well is filled, designated by the voltage $E_B$, representing the quasi-Fermi energy level for the charge in the first potential well. However, this thermal noise is a relatively small quantity which is proportional to the square root of both the capacitance and the absolute temperature. In numerical terms, the r.m.s. noise fluctuations in the input signal at room temperature is expected to equal 400 $\sqrt{C}$, where C is the effective capacitance of the first potential well, in picofarads.

In one series of tests which were performed, the total noise introduced (including thermal noise) in the storage of charge by the present method was found to be about one-third of that which is produced by the previous method in which the input signal had shot noise. The measurements of the previous method of introducing charge signal subject to partition noise found them to be more noisy than the previous method subject to shot noise.

The amount of charge signal introduced into the first potential well is proportional to the difference between the voltages $V_1$ and $V_2$. Accordingly, by making one of these quantities ($V_2$) ahe input signal and the other ($V_1$) a fixed voltage level, a charge signal can be introduced proportional to such signal.

As now well understood in this art, in some applications, in the interest of increased charge transfer efficiency, it is important always to have some residual charge present in the first potential well which is subsequently propagated. Such a charge signal, sometimes known as "fat zero", may be introduced in the present invention by proper choice in the difference in potential between $V_1$ and $V_2$.

After introduction of the signal into the first potential well in the manner discussed above, it may be propagated by changing the value of the voltage $V_3$ and applying the multiple phase voltages $\phi_1$, $\phi_2$, and $\phi_3$. At time $t_3$, the voltage $V_3$ may be made relatively negative so as to form a relatively deeper potential well beneath electrode $G_3$ than beneath electrode $G_2$. At the same time, the first phase voltage $\phi_1$ is made even more negative than $V_3$. The result of these actions is the propagation of charge signal from the potential well beneath electrode $G_2$ to the potential well beneath $G_4$ in the manner illustrated schematically at (c) in FIG. 3. At time $t_4$, $V_3$ goes relatively positive again, forming a potential barrier between the well beneath electrode $G_2$ and the well beneath electrode $G_4$. The process of establishing a new charge in the first potential well now can be started again and concurrently the charge beneath electrode $G_4$ can be shifted to the right by the application of appropriate voltages $\phi_1$, $\phi_2$ and $\phi_3$.

Before leaving the subject of noise, one other aspect of this matter should be discussed. It is illustrated in FIG. 3 at (c). At the time $t_3$, there may be some relatively small number of charge carriers present beneath the gate electrode $G_1$. Some of these charge carriers that travel to the right and end up in the potential well beneath the electrode $G_4$ result in additional noise fluctuations. This type of noise is of the same kind as the partition noise already discussed. However, since the carriers of interest are only those present due to thermal noise, this partition noise is distinctly a second order effect in the present arrangement.

Figure 4:
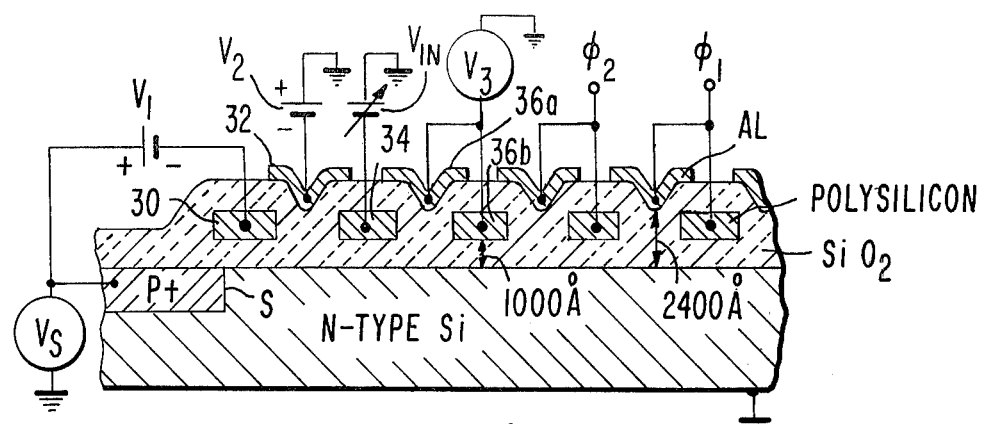
FIG. 4 is a section through the input circuit to a charge-coupled circuit operated in accordance with another form of the present invention.

The circuit of FIG. 4 is a two-phase embodiment of the present invention. The structure is somewhat different than that of FIG. 2 but the general principle of operation is the same. In the embodiment of FIG. 4, the source electrode S is maintained at a fixed potential difference $V_1$ from the first gate electrode 30 and acts like an extension of the source diffusion. The second gate electrode 32 is maintained at a relatively negative potential such that the surface potential beneath this electrode is always more positive than that beneath electrode 30. In the example illustrated, this surface potential is −5 volts and it does not change. The third gate electrode 34 is at some potential $V_{in}$ proportional to the input signal. Since during any filling operation $V_{in}$ remains at a relatively fixed value, the source of this voltage is illustrated as a battery with an arrow through it indicating that the fixed value can be changed. The next pair of electrodes 36a, 36b can be considered the circuit for coupling the charge accumulated in the first potential well (the well beneath electrode 34) to the remainder of the charge coupled register.

Figure 5:
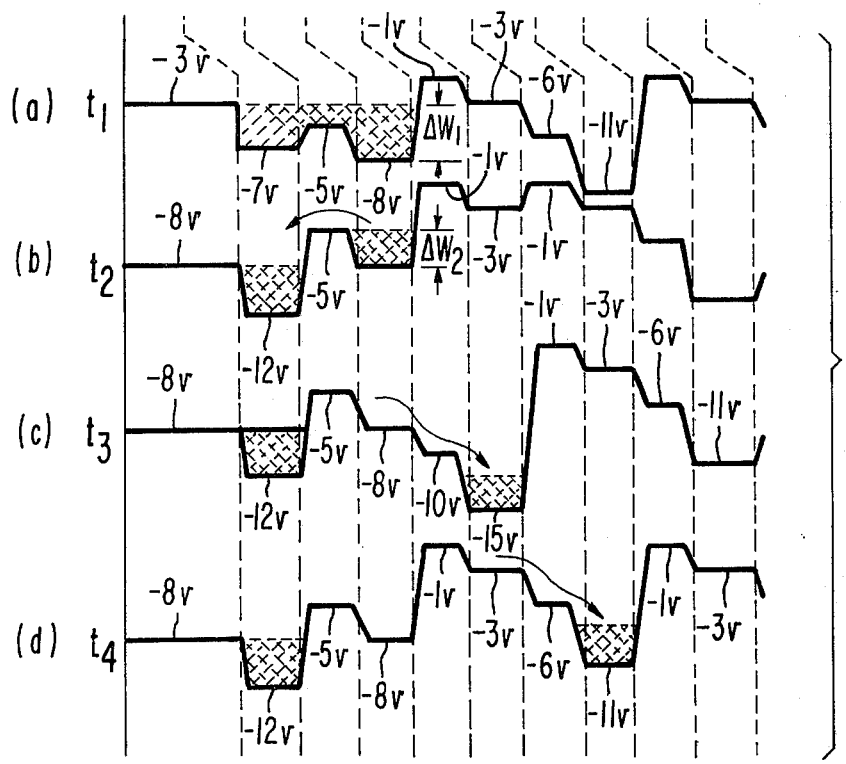
FIG. 5 is a drawing of surface potentials to help explain the operation of the circuit of FIG. 4.
Figure 6:
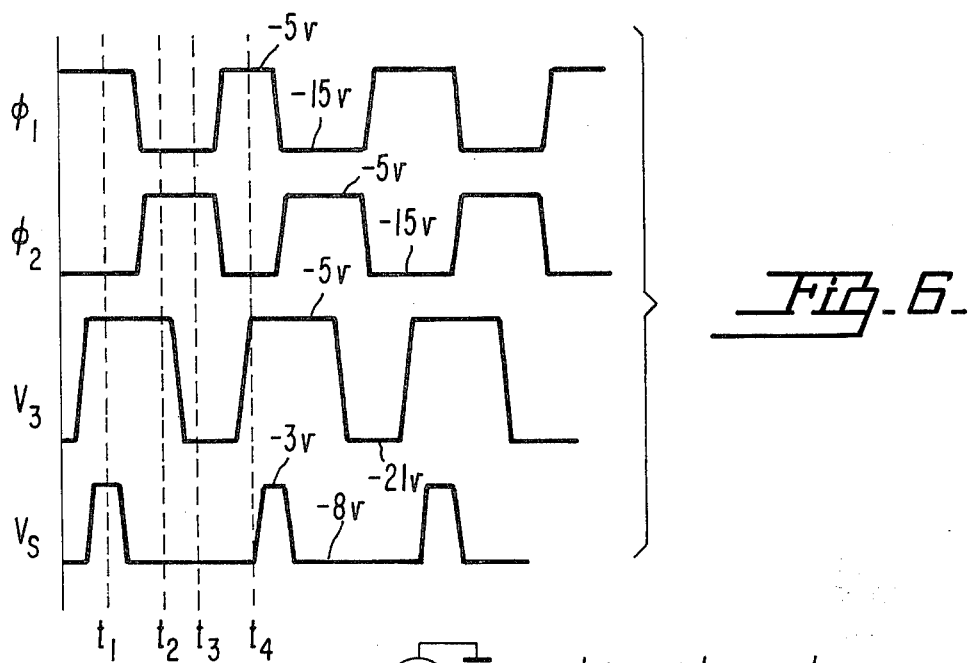
FIG. 6 is a drawing of waveforms employed to operate the circuit of FIG. 4.

The operation of the circuit of FIG. 4 is illustrated in FIGS. 5 and 6. At time $t_1$, the source S may be at a potential of −3 volts and the gate electrode 30 at a sufficiently negative potential to produce a −7 volt surface potential beneath gate 30. (The surface potential here and in the following figures is approximate and is for a substrate doping of $10^{16} cm^{-3}$.) Electrode 34 is at a potential such that the surface potential beneath this electrode is −8 volts. Accordingly, charge carriers initially flow through the conduction channel beneath electrode 30 and over the potential barrier of −5 volts and into the first potential well. The effective depth of the first potential well is $\Delta W_1$ which in this example is 5 volts.

At time $t_2$, the source voltage has changed from −3 volts to −8 volts. At −3 volts, the source S acts as a source of charge carriers; however, at −8 volts the diffusion S acts as a drain for charge carriers. The change in the voltage of the source diffusion from −3 volts to −8 volts effectively reduces the depth of the first potential well from $\Delta W_1 = 5$ volts to $\Delta W_2 = 3$ volts. Some of the charge carriers flowing out of the first potential well remain accumulated in the −12 volts potential well which now exists beneath electrode 30. The remaining carriers, if any, flow to the drain electrode.

Summarizing the steps above, at time $t_1$ the first potential well is relatively deep and fills to the extent of $\Delta W_1$; at time $t_2$ the effective depth of this well is reduced and a portion of the charge carriers formerly present is removed. As in the embodiment of FIG. 1, the coming to equilibrium process is well defined depending only on the accuracy with which the −8 volt and −5 volt surface potentials can be maintained and the charge remaining, $\Delta W_2$, is accurately predictable.

At times $t_3$ and $t_4$, the charge present in the first potential well is first shifted into the well beneath electrode 36b and then is shifted to the first pair of phase electrodes of the charge-coupled register. The process is believed to be self evident from the drawing and need not be discussed further.

Figure 7:
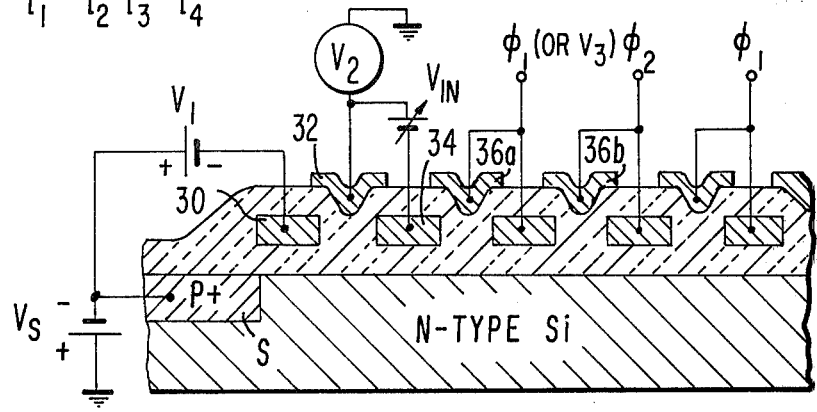
FIG. 7 is a section through an input curcuit operated in accordance with another form of the present invention.

In the embodiment of the invention illustrated in FIG. 7, the source electrode S is maintained at a fixed potential $V_S$ and the first electrode 30 is at a fixed potential difference $V_1$ from the source electrode. Electrode 32 is driven by control voltage pulses $V_2$ (shown in FIG. 9) and the input signal $V_{in}$ may be applied between electrode 32 and electrode 34. The remaining electrode pairs are conventionally operated by two-phase voltages.

Figure 8:
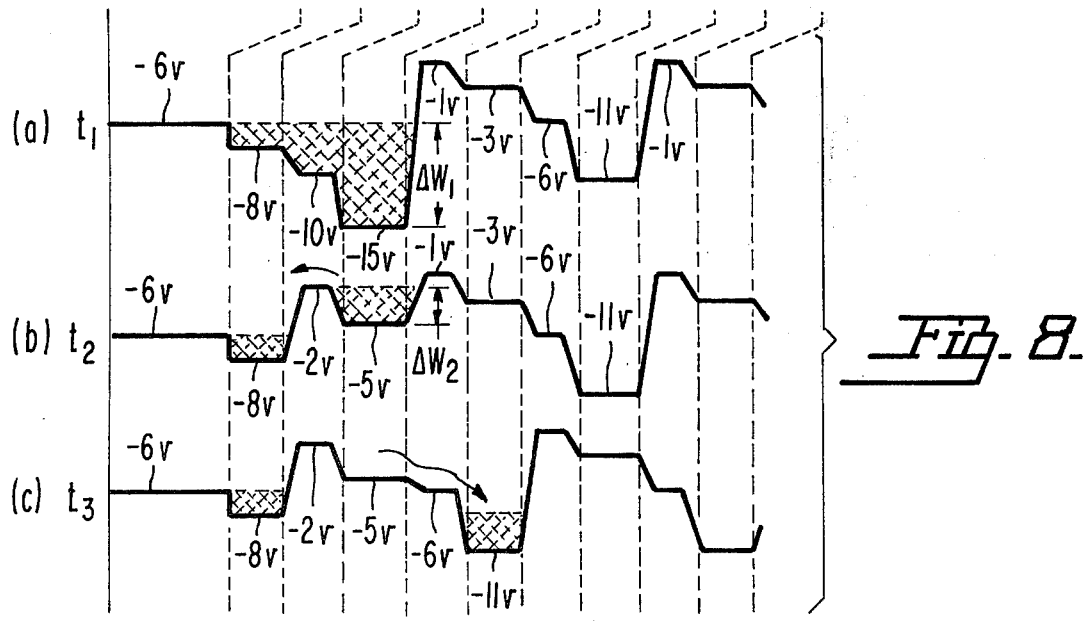
FIG. 8 is a drawing of surface potentials present in the circuit of FIG. 7.
Figure 9:
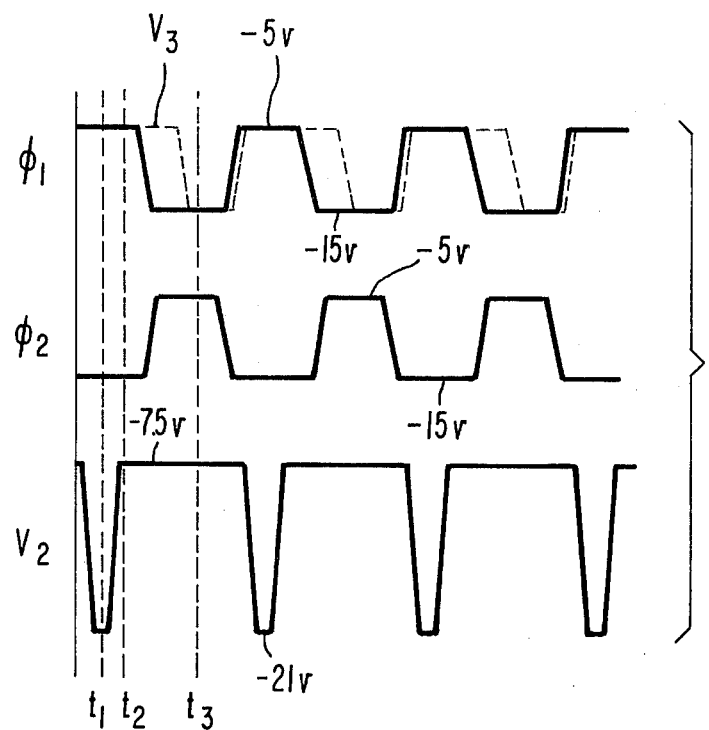
FIG. 9 is a drawing of waveforms employed in the operation of the circuit of FIG. 7.

The operation of the FIG. 7 circuit is illustrated in FIGS. 8 and 9. At time $t_1$, the various potentials are such that the surface potential profile shown at (a) in FIG. 8 exists. Charge carriers flow from the source electrode S through the conduction channel beneath electrode 30 and into the potential well beneath electrodes 32 and 34. The effective depth of this potential well is $\Delta W_1 = 9$ volts.

At time $t_2$, the voltage $V_2$ has gone from a relatively negative value of −21 volts to a relatively positive value of −7.5 volts, resulting in a change of the surface potential beneath electrode 32 from −10 to −2 volts and a change in the surface potential beneath electrode 34 from −15 volts to −5 volts. The result of this change in potential of $V_2$ is to change the effective depth of the first potential well from $\Delta W_1 = 9$ volts to $\Delta W_2 = 3$ volts. The charge formerly present in the first potential well flows in part into what now can be considered a potential well beneath electrode 30 and any excess charge flows into the source electrode S which now operates as a drain (note that while the source potential remains −6 volts, it is now more negative than the −2 volt surface potential beneath electrode 32). The charge $\Delta W_2$ subsequently may be transferred in the manner indicated at (c) in FIG. 8 and indicated also by the waveforms of FIG. 9.

In some applications it may be desired that more time be available than shown by solid line in FIG. 9 for the removal of a portion of the charge from the first potential well (from the well beneath electrode 34). In this case, the wave applied to the electrode pair 36a, 36b may be $V_3$ rather than $\phi_1$. This wave is shown in dashed line at the top of FIG. 9. Note that this wave permits more time between the charge of the voltage $V_2$ from −21 volts to −7 ½ volts and the time at which the shifting of the charge beneath electrode 34 to beneath electrode 36b begins. Thus, more time is available for settling, that is, for permitting the charge in the first potential well to come to equilibrium, before the shifting of charge begins.

Figure 10:
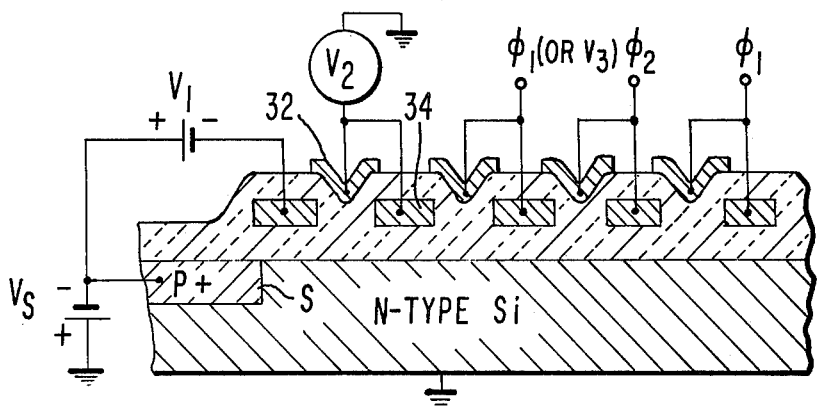
FIG. 10 is a section through an input circuit operated in accordance with another form of the present invention.

For certain applications, such as charge-coupled devices image sensing lines or arrays, the low-noise electrically introduced background charge (fat zero) already referred to can be introduced by a circuit such as shown in FIG. 7 by maintaining $V_{in}$ at a fixed potential level. Alternatively, a circuit such as shown in FIG. 10 may be employed. Here the operation is essentially identical with that of the FIG. 7 circuit, except that the potential hill created by electrode 32 relative to the potential well of electrode 34 is produced simply by the difference in relative spacings of these electrodes from the substrate. In other words, as the polysilicon electrode 34 is spaced substantially closer to the substrate than the electrode 32, even though both are at the same potential a relatively deeper well forms beneath electrode 34 than beneath electrode 32. The difference between these surface potentials beneath these electrodes defines the amplitude of the fat zero charge. The operation of the FIG. 10 embodiment is exactly as depicted in FIGS. 8 and 9.

Other alternatives for fat zero generation are to form a difference in surface potentials beneath the electrode 32 and the electrode 34 by means of charge in the oxide, by a difference in substrate doping, or simply by the difference in the work function of the two electrodes. This creates an asymmetrical potential well of the same type as just discussed. The first of these ways of creating asymmetrical potentials is described in co-pending application Ser. No. 173,152 for "Charge Coupled Circuits" filed Aug. 19, 1971 by the present inventor and assigned to the same assignee as the present application.

The various forms of the invention shown in the present application are merely examples. It is to be understood that, for example, charge coupled circuits employing P type substrates rather than N type substrates may be operated in the same way as described, provided appropriate voltage levels are chosen. It is also to be understood that different forms of electrode structures may be employed and also that the invention is applicable to four and higher phase systems.

The discussed concepts are also applicable for introducing low noise electrical input signals to the so-called buried channel charge-coupled devices in which case the charge flows not at the surface of the substrate but the potential minima for the charge carriers are formed at some small distance (on the order of 1.0 μm) beneath the surface of the substrate. Also, while examples given here are for single registers, it is to be understood that these concepts apply to multiplicities of such registers as, for example, in the case of area image sensors.

What is claimed is:

1. A charge-coupled circuit comprising, in combination:
   a semiconductor substrate of one conductivity type;
   a diffusion in said substrate of different conductivity type;
   a plurality of electrode means coupled to and insulated from said substrate for producing potentials at the substrate for the accumulation and propagation of charge signals originating at said diffusion;
   means including a first of said electrode means close to said diffusion and means for applying a potential to said first electrode means for forming a conduction channel for charge carriers in said substrate between said diffusion and the region of said substrate beneath said first electrode means;
   means for applying a signal potential whose value may vary between a second of said electrode means adjacent to said first electrode means and said first electrode means for producing a potential well of a depth sufficient to accumulate charge carriers flowing through said conduction channel;
   means for applying a potential to a third of said electrode means adjacent to the second of said electrode means for producing a first potential barrier at the substrate;
   means for operating said diffusion at a potential such that it produces charge carriers which flow through said conduction channel for an interval at least sufficient to fill said well to a given depth with carriers; and
   means for changing the difference in potential between said diffusion and said second electrode means in a sense to permit said diffusion to operate as a drain for charge carriers in excess in said potential well while said signal potential is present between said first electrode means and said second electrode means such that a potential barrier is present between said diffusion and first well of a height lower than said first barrier and which permits a number of charge carriers to flow out of said well to said diffusion sufficient to leave in said well charge at a level indicative of said signal potential.

2. In a charge-coupled circuit as set forth in claim 1 said means for charging the potential between said diffusion and said second electrode means while a signal potential is present between said first electrode means and said second electrode means comprising means for changing, in unison, the potentials of said first and second electrode means while maintaining the potential difference between them fixed, while maintaining said diffusion at a fixed potential.

3. In a charge-coupled circuit as set forth in claim 1, further including means for maintaining a fixed direct current offset potential between said first and second electrode means.

4. A charge-coupled circuit comprising, in combination:
   a semiconductor substrate;
   a region in said substrate of different conductivity type than said substrate;
   a plurality of electrode means coupled to and insulated from said substrate for producing potentials at the substrate for the accumulation and propagation of charge signals originating at said region, at least some of said electrode means driven by multiple phase voltages but the first and second of said electrode means, identified below, being disconnected from said multiple phase voltages;
   means including said first of said electrode means close to said region and means for applying a potential to said first electrode means for forming a conduction channel for charge carriers in said substrate between said region and the portion of said substrate beneath said first electrode means;
   means, including means for applying a signal potential whose value may vary between said second of said electrode means adjacent to said first electrode means and said first electrode means, for producing a potential well in the substrate beneath said second electrode means of a depth sufficient to accumulate charge carriers flowing through said conduction channel;

means for applying a potential to a third of said electrode means adjacent to the second of said electrode means for producing a first potential barrier at the substrate;

means for operating said region at a potential such that it produces charge carrier which flow through said conduction channel for an interval at least sufficient to fill said well to a given depth with carriers;

and means for changing the difference in potential between said region and said second electrode means in a sense to permit said region to operate as a drain for charge carriers in excess in said potential well while said signal potential is present between said first electrode means and said second electrode means so that a potential barrier is present between said region and first well of a height lower than said first barrier and which permits a number of charge carriers to flow out of said well to said region sufficient to leave in said well charge at a level indicative of said signal potential.

5. A charge-coupled circuit as set forth in claim 4 wherein said means for charging the difference in potential between said region and said second electrode means comprises means for charging the potential of said region while maintaining the potential of said first electrode means fixed.

6. A charge-coupled circuit as set forth in claim 4 wherein said means for changing the difference in potential between said region and said second electrode means while said first electrode means is at a potential such that a potential barrier is present comprises means for changing, in unison, the potentials of said first and second electrodes while maintaining the potential difference between them fixed and while maintaining said region at a fixed potential.

7. A charge-couple circuit as set forth in claim 4, said first electrode means being laterally spaced from said region, and said means including said first electrode means for forming a conduction channel between said region and the portion of said substrate beneath said first electrode means further including an electrode coupled to the portion of the substrate means between said first electrode means and said region, said electrode maintained at a fixed potential offset from said region in a sense to form a conduction channel in a portion of the substrate beneath said electrode which extends from said region to the portion of the substrate beneath said first electrode means.

8. Control circuitry for a semiconductor signal charge transfer device, having a substrate formed with an input source region which can supply charge via an input gate region of said substrate to a first transfer site in said substrate in response to applied voltages, which comprises:

storage electrode means adjacant to said first transfer site for controlling the latters potential;

gate electrode means adjacent to said input gate region for controlling the latters potential;

first circuit means for applying voltages to said storage electrode means and to said gate electrode means, said first circuit means including means for applying a signal voltage whose value may vary between said storage electrode means and said gate electrode means, for creating a potential well at the first transfer site, and a shallower potential well at said input gate region;

second circuit means for applying a charge injecting voltage pulse between said input source and said storage electrode means for a first time period, of an amplitude sufficient for the transport of a predetermined signal-independent charge from said source region to said potential well of said first transfer site and for then removing said pulse, whereby charge tends to return from said first transfer site to said input source region; and means for continuing to apply said signal voltage between said gate electrode means and said storage electrode means during a second time period immediately following said first time period and which outlasts said first time period, for controlling the retransportation of said signal-independent charge from the first transfer site through the gate region back to the input source during said second time period, in accordance with said signal voltage.

9. In a charge coupled circuit which includes a semiconductor substrate, source electrode means in the substrate, storage electrode means insulated from the substrate, and gate electrode means insulated from the substrate and located between the storage electrode means and said source electrode means for controlling the flow of charge between the source electrode means and the substrate region beneath the storage electrode means, in combination:

means coupled to said gate electrode means and to said storage electrode means, including means for applying between the gate electrode means and the storage electrode means a signal potential which may vary, and means supplying a bias potential, for creating a potential well beneath the storage electrode means and a shallower potential well beneath the gate electrode means;

means including said means supplying a bias potential for creating a potential difference between said source electrode means and said storage electrode means, during a first time period, for causing a flow of charge from said source electrode means to the potential well beneath said storage electrode means proportional to said difference and independent of said signal potential; and means for changing the potential difference between said storage electrode means and said source electrode means, during a second time period following the first in a sense to return charge from the potential well beneath said storage electrode means to said source electrode means to an extent to leave stored beneath said storage electrode means an amount of charge dependent on said signal potential.

* * * * *

UNITED STATES PATENT OFFICE
CERTIFICATE OF CORRECTION

PATENT NO. : 3,986,198
DATED : October 12, 1976
INVENTOR(S) : Walter Frank Kosonocky It is certified that error appears in the above-identified patent and that said Letters Patent are hereby corrected as shown below:

Column 1, line 55, change "cicuit" to read --circuit--.

Column 6, line 64, change "charge" to read --change--.

Column 7, line 5, change "(fat zero)" to read --("fat zero")--

Column 8, line 31, change "charging" to read --changing--.

Column 9, line 8, change "carrier" to read --carriers--.

Column 9, line 27, change "charging" to read --changing--.

Column 9, line 39, change "couple" to read --coupled--.

Signed and Sealed this

Fourth Day of January 1977

[SEAL]

Attest:

RUTH C. MASON
*Attesting Officer*

C. MARSHALL DANN
*Commissioner of Patents and Trademarks*